US 7,349,214 B2

(12) United States Patent
Jeong

(10) Patent No.: US 7,349,214 B2
(45) Date of Patent: Mar. 25, 2008

(54) HEAT DISSIPATION STRUCTURE OF INTELLIGENT POWER MODULE, DISPLAY MODULE HAVING THE SAME, AND METHOD FOR INSTALLING HEAT DISSIPATION PLATE FOR INTELLIGENT POWER MODULE

(75) Inventor: Kwang-Jin Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 105 days.

(21) Appl. No.: 11/331,079

(22) Filed: Jan. 13, 2006

(65) Prior Publication Data

US 2006/0158853 A1    Jul. 20, 2006

(30) Foreign Application Priority Data

Jan. 15, 2005   (KR)   .............. 10-2005-0003980

(51) Int. Cl.
*H05K 7/20*   (2006.01)
*F28D 15/00*   (2006.01)

(52) U.S. Cl. .............. 361/704; 361/709; 361/719; 165/104.33; 165/185; 174/16.3

(58) Field of Classification Search .......... 361/697, 361/704, 707, 709–710, 719; 165/80.3, 104.33, 165/185; 174/16.3
See application file for complete search history.

(56) References Cited

U.S. PATENT DOCUMENTS 5,134,545 A * 7/1992 Smith ................ 361/712
5,548,482 A * 8/1996 Hatauchi et al. ......... 361/720
5,699,229 A * 12/1997 Brownell ................. 361/719
6,044,899 A * 4/2000 Langley et al. ...... 165/104.33
6,798,661 B1 * 9/2004 Barsun et al. ............ 361/700
2005/0259401 A1 * 11/2005 Han et al. ................ 361/704

FOREIGN PATENT DOCUMENTS

| JP | 2000338904 A | * 12/2000 |
| KR | 2003093750 A | * 12/2003 |
| KR | 10-2006-0066539 | 6/2006 |

OTHER PUBLICATIONS

Korean Office action for Korean patent application No. 2005-0003980 issued on Aug. 28, 2006.

* cited by examiner

*Primary Examiner*—Jayprakash Gandhi
*Assistant Examiner*—Robert J Hoffberg
(74) *Attorney, Agent, or Firm*—Robert E. Bushnell, Esq.

(57) ABSTRACT

A heat dissipation structure of an intelligent power module includes a chassis base, a drive circuit board arranged on the chassis base, an intelligent power module arranged at a side of the drive circuit board, the intelligent power module comprising a plurality of circuit devices, a first heat dissipater having one surface contacting a surface of the intelligent power module, the first heat dissipater being adapted to dissipate heat generated by operation of the plurality of circuit devices, and a second heat dissipater having one side arranged in contact with another surface of the first heat dissipater and another side arranged to contact a surface of the chassis base.

14 Claims, 5 Drawing Sheets

HEAT DISSIPATION STRUCTURE OF INTELLIGENT POWER MODULE, DISPLAY MODULE HAVING THE SAME, AND METHOD FOR INSTALLING HEAT DISSIPATION PLATE FOR INTELLIGENT POWER MODULE

CLAIM OF PRIORITY

This application makes reference to, incorporates the same herein, and claims all benefits accruing under 35 U.S.C.§ 119 from an application for HEAT DISSIPATION STRUCTURE OF INTELLIGENT POWER MODULE, DISPLAY MODULE HAVING THE SAME, AND METHOD FOR INSTALLING HEAT DISSIPATION PLATE FOR INTELLIGENT POWER MODULE earlier filed in the Korean Intellectual Property Office on 15 Jan. 2005 and there duly assigned Ser. No. 10-2005-0003980.

BACKGROUND OF THE INVENTION

1. Field of the Invention

A heat dissipation structure of an intelligent power module, a display module having the same, and a method for installing the heat dissipation structure, and more particularly, to a heat dissipation structure of an intelligent power module that has improved heat dissipation performance and is easy to install, a display module having the same, and a method for installing the heat dissipation structure for the intelligent power module.

2. Description of the Related Art

A display module includes a display panel, a plurality of drive circuit boards electrically connected to the display panel via a plurality of connection cables, and a chassis base supporting the display panel and the drive circuit boards.

Typically, the display panel is attached to a front surface of the chassis base. In particular, for a plasma display panel, the display panel includes a front panel and a rear panel that are coupled together. The drive circuit boards are attached to a rear surface of the chassis base. The chassis base protects the display panel and the drive circuit boards from being deformed by external impact or from its own weight. To reinforce the strength of the chassis base, a reinforcement member is installed on an upper surface of the chassis base in an area where the drive circuit boards are not located.

The drive circuit board is fixed to the chassis base via a fixing member and a screw. A plurality of circuit devices are installed on an upper surface of the drive circuit board. An intelligent power module includes a small board, a circuit device, and a plurality of connection pins. A heat dissipater is attached to the intelligent power module. The intelligent power module is a package on a small board that includes a power device such as an insulated gate bipolar transistor (IGBT), a bipolar junction transistor (BJT), and a fast recovery diode (FRD), a protective board, a drive board, and a control board. The shape or structure of the intelligent power module can vary according to the purpose and system requirements. The intelligent power module as a system on package (SOP) product is an electronic circuit module which exhibits superior and various functions and high productivity. The intelligent power module is widely used in electric home appliances and in industrial products.

In the intelligent power module, a large amount of heat is generated during operation, especially when there are frequent switch operations and when transformations are performed. Accordingly, the intelligent power module is designed to be provided with a heat dissipater to draw heat away from the circuits. When applied to a product such as a display, the intelligent power module is installed on the drive circuit board using the connection pins and the heat dissipater is installed on the upper surface of the small board. However, the heat dissipater by itself is insufficient in preventing the circuit devices from being damaged by heat or from malfunctioning. Therefore, what is needed is an improved design for a heat dissipation structure for an intelligent power module that can more effectively protect the circuit devices from heat.

SUMMARY OF THE INVENTION

It is therefore an object of the present invention to provide an improved heat dissipation structure for an intelligent power module.

It is also an object of the present invention to provide a design for a display having the improved heat dissipation structure for the intelligent power module within the display.

It is yet an object of the present invention to provide a method of installing the heat dissipation structure for the intelligent power module.

It is further an object of the present invention to provide a heat dissipation structure of an intelligent power module that has improved heat dissipation performance and is easy to install, a display module having the heat dissipation structure, and a method for installing a heat dissipater for the intelligent power module.

According to an aspect of the present invention, there is provided a heat dissipation structure that includes a chassis base, a drive circuit board arranged on the chassis base, an intelligent power module arranged at a side of the drive circuit board, the intelligent power module comprising a plurality of circuit devices, a first heat dissipater having one surface contacting a surface of the intelligent power module, the first heat dissipater being adapted to dissipate heat generated by operation of the plurality of circuit devices and a second heat dissipater having one side arranged in contact with another surface of the first heat dissipater and another side arranged to contact a surface of the chassis base.

The first heat dissipater can include a plurality of fins, each of said fins can have a plate shape and being arranged orthogonal to the drive circuit board.

The one side of the second heat dissipater can be attached to the first heat dissipater via a first coupler and the another side of the second heat dissipater can be attached to the chassis base via a second coupler.

The another side of the second heat dissipater can be attached to the chassis base via a first coupler and the one side of the second heat dissipater can be adapted to apply an elastic force toward the another surface of the first heat dissipater.

The plurality of circuit devices can include a power device, a protection circuit, a drive circuit, and a control circuit.

The second heat dissipater can be adapted to transfer heat from the first heat dissipater to the chassis base.

According to another aspect of the present invention, there is provided a display module that includes a display panel, a drive circuit board adapted to drive the display panel, a chassis base supporting the display panel and the drive circuit board, an intelligent power module arranged at a side of the drive circuit board, the intelligent power module comprising a plurality of circuit devices, a first heat dissipater having one surface contacting a surface of the intelligent power module, the first heat dissipater being adapted to dissipate heat generated by operation of the plurality of circuit devices, and a second heat dissipater having a one side arranged to contact another surface of the first heat dissipater and another side arranged to contact one of the drive circuit board and the chassis base.

The first heat dissipater can include a plurality of fins, each fin having a plate shape being arranged orthogonal to the drive circuit board.

The one side of the second heat dissipater can be attached to the another surface of the first heat dissipater via a first coupler and the another side of the second heat dissipater can be attached to the one of the drive circuit board and the chassis base via a second coupler.

The second heat dissipater can be an elastic body, the one side of the second heat dissipater can be arranged to apply an elastic force to the another surface of the first heat dissipater and the another side of the second heat dissipater can be attached to the one of the drive circuit board and the chassis base via a first coupler.

The plurality of circuit devices can include a power device, a protection circuit, a drive circuit, and a control circuit.

The display module can be a plasma display module that can be adapted for a plasma display device.

The second heat dissipater can be arranged to transfer heat from the first heat dissipater to the one of the drive circuit board and the chassis base.

According to yet another aspect of the present invention, there is provided a method for installing a heat dissipater, including fixing a first heat dissipater comprising an elastic body to one of a drive circuit board and a chassis base and installing a second heat dissipater to closely contact the first heat dissipater while deforming the first heat dissipater in a direction opposite a direction that an elastic force of the first heat dissipater acts.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
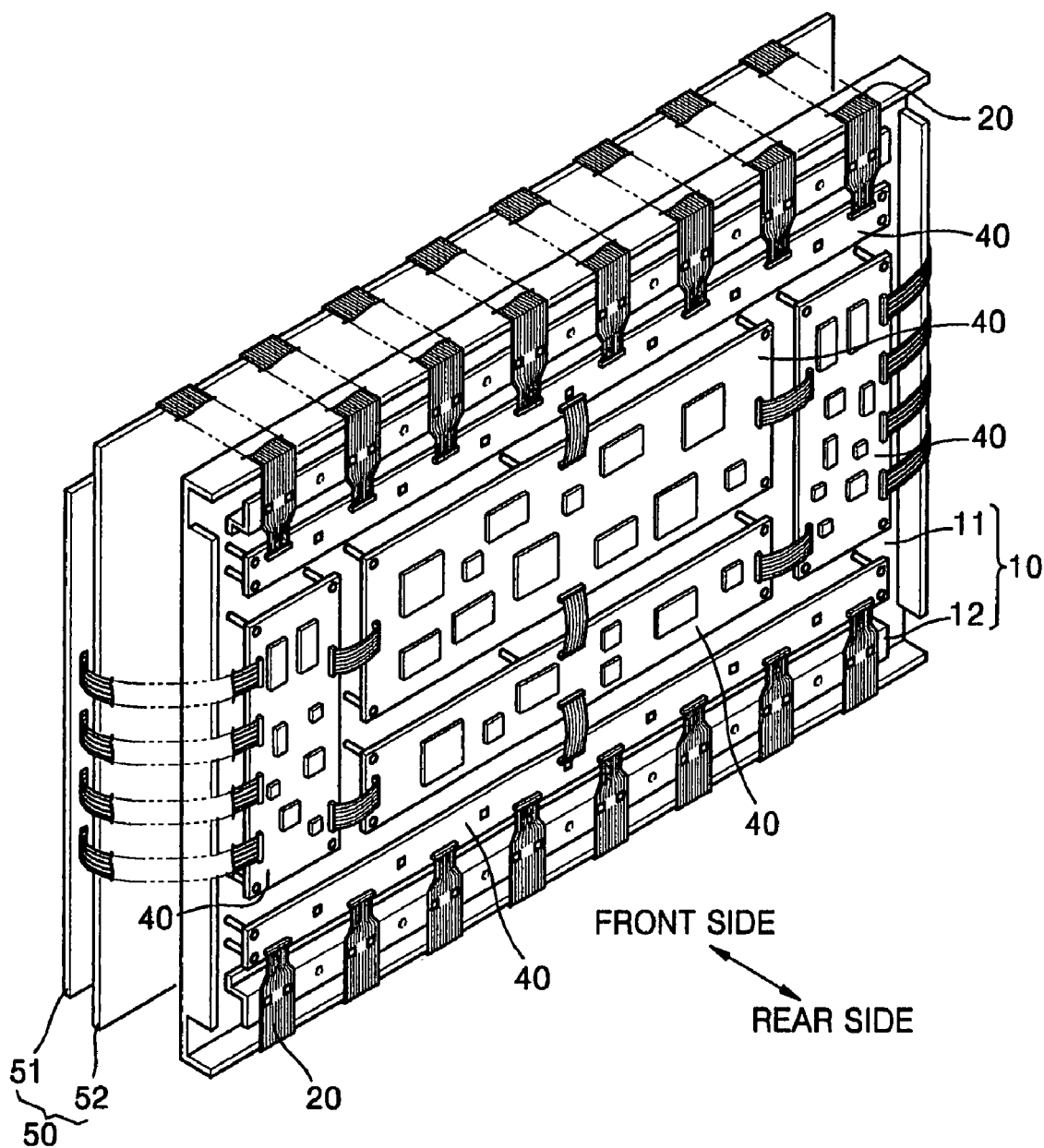
FIG. 1 is a perspective view of a display module of a plasma display device.

Turning now to the figures, FIG. 1 is a perspective view of a display module of a plasma display device. Referring now to FIG. 1, the display module includes a display panel 50, a plurality of drive circuit boards 40 electrically connected to the display panel 50 via a plurality of connection cables 20, and a chassis 10 including a chassis base 11 supporting the display panel 50 and the drive circuit boards 40.

Typically, the display panel 50 is attached to a front surface of the chassis base 11. In particular, for a plasma display panel, the display panel 50 includes a front panel 51 and a rear panel 52 which are coupled together. The drive circuit boards 40 are attached to a rear surface of the chassis base 11. The chassis base 11 protects the display panel 50 and the drive circuit boards 40 from being deformed by external impact or from its own weight. To reinforce the strength of the chassis base 11, a reinforcement member 12 is installed on an upper surface of the chassis base 11 in an area where the drive circuit boards 40 are not located.

Figure 2:
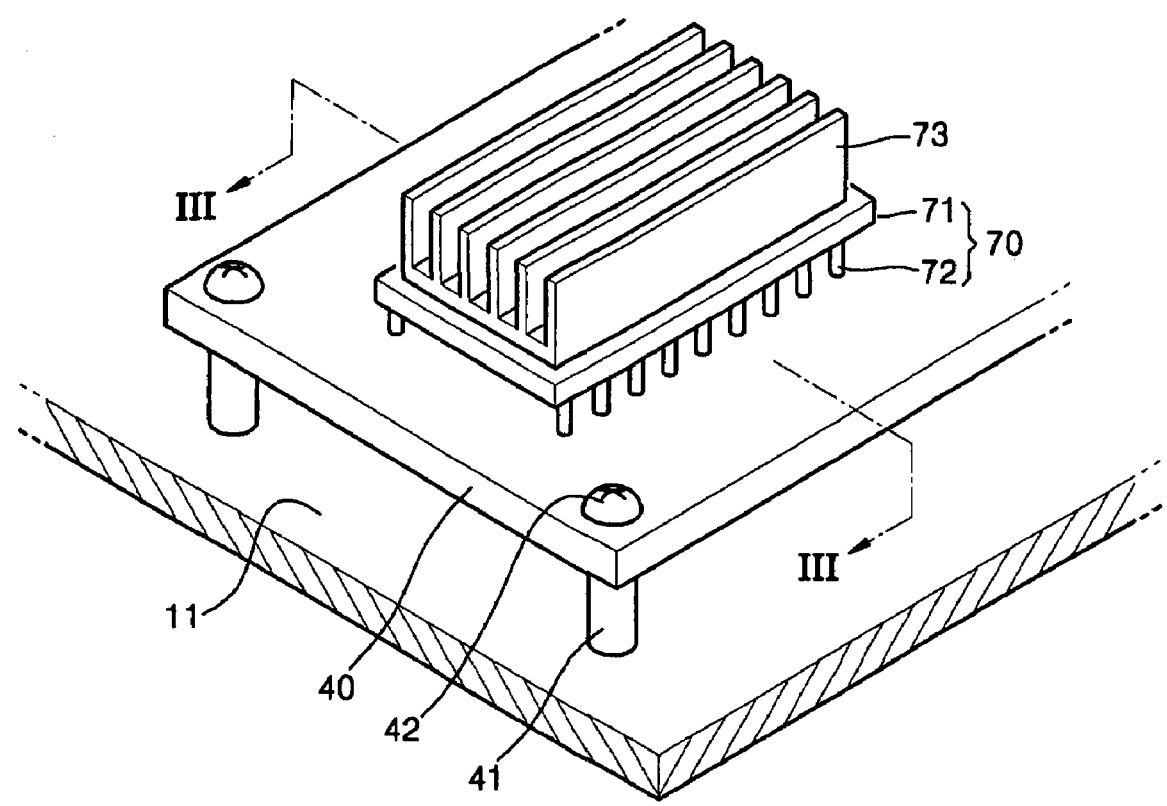
FIG. 2 is an enlarged perspective view of one of the drive circuit boards located on the display module of FIG. 1.
Figure 3:
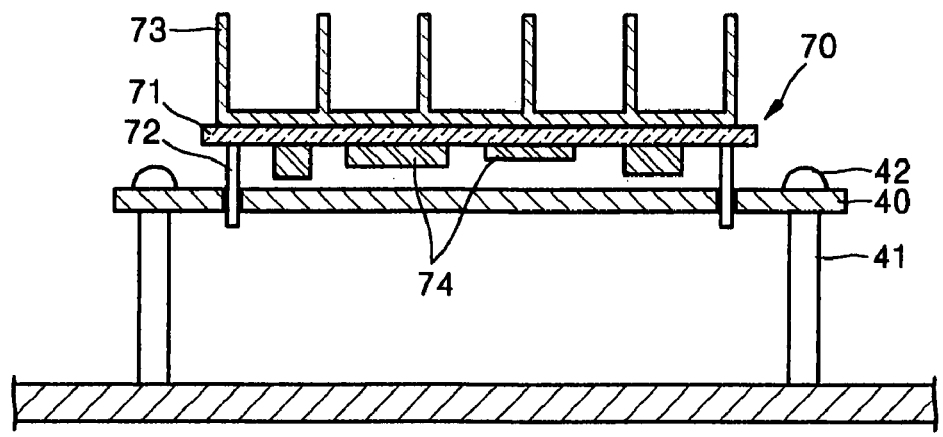
FIG. 3 is a cross-sectional view taken along line III-III of FIG. 2.

Turning now to FIGS. 2 and 3, FIG. 2 is an enlarged perspective view illustrating one of the drive circuit boards 40 located on the display module of FIG. 1 and FIG. 3 is a cross-sectional view taken along line III-III of the drive circuit board 40 of FIG. 2. As illustrated in FIGS. 2 and 3, the drive circuit board 40 is fixed to the chassis base 11 using a fixing member 41 and a screw 42. A plurality of circuit devices are installed on an upper surface of the drive circuit board 40. As shown in FIGS. 2 and 3, an intelligent power module 70 includes a small board 71, a circuit device 74, and a plurality of connection pins 72. A heat dissipater 73 is attached to the intelligent power module 70. The intelligent power module 70 is a package on the small board 71 which includes a power device such as an insulated gate bipolar transistor (IGBT), a bipolar junction transistor (BJT), and a fast recovery diode (FRD), a protective board, a drive board, and a control board. The shape or structure of the intelligent power module 70 can vary according to the purpose and system requirements. The intelligent power module 70, as a system on package (SOP) product, is an electronic circuit module that exhibits superior and various functions with high productivity. The intelligent power module 70 has been widely used from electric home appliances to industrial products.

In the intelligent power module 70 of FIGS. 2 and 3, a large amount of heat is generated during the operation thereof due to frequent switch operations and transformations. Accordingly, the intelligent power module 70 is designed to have a heat dissipater. When applied to a product as shown in FIGS. 2 and 3, the intelligent power module 70 is installed on the drive circuit board 40 using the connection pins 72. The heat dissipater 73 is installed on the upper surface of the small board 71. However, the presence of the heat dissipater 73 alone is insufficient in preventing the circuit devices from being damaged by heat or from malfunctioning.

Figure 4:
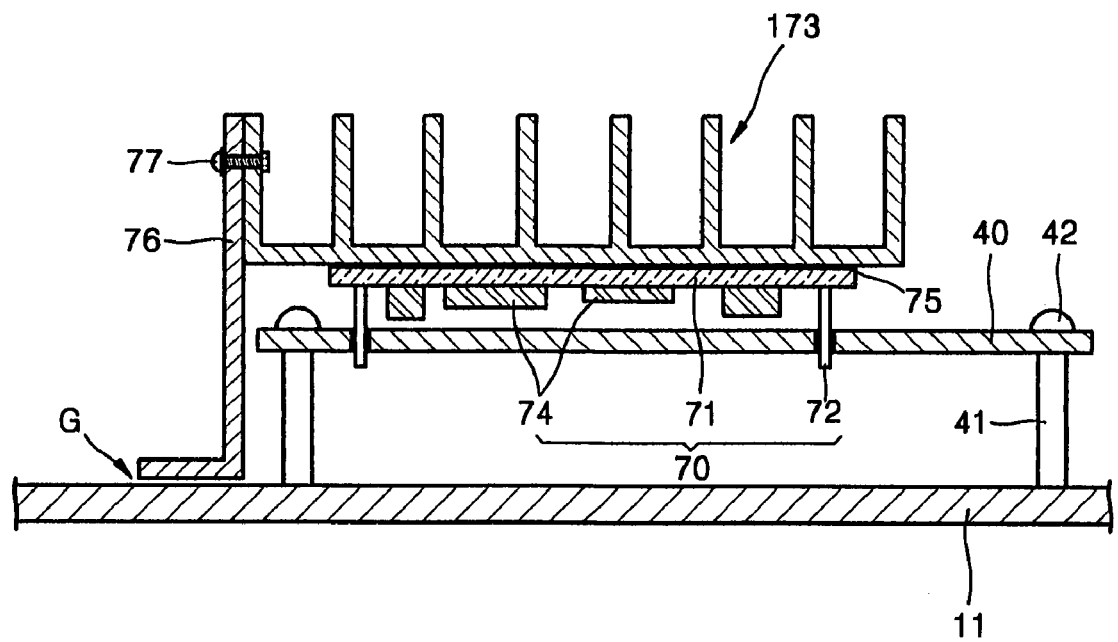
FIG. 4 is a cross-sectional view of a heat dissipation structure of an intelligent power module according to a first embodiment of the present invention.

Turning now to FIG. 4, FIG. 4 is a cross-sectional view of a heat dissipation structure of an intelligent power module according to a first embodiment of the present invention. Referring to FIG. 4, the heat dissipation structure of an intelligent power module includes the chassis base 11, an intelligent power module 70, a first heat dissipater 173, and a second heat dissipater 76. The circuit boards 40 can be typical printed circuit boards (PCBs). In the case of being applied to a display module as in the present invention, the circuit boards 40 are installed on a rear surface of the chassis base 11. When installed on the rear surface of the chassis base 11, the circuit boards 40 are coupled using a screw 42 to a boss (not illustrated) that is installed on the rear surface of the chassis base 11.

The intelligent power module 70 includes the circuit devices 74. The intelligent power module 70 is installed at one side of the drive circuit boards 40 using the connection pins 72. The circuit devices 74 include a power device such as an insulated gate bipolar transistor (IGBT), a bipolar junction transistor (BJT), and a fast recovery diode (FRD). A protective circuit, a drive circuit, and a control circuit can be embodied in the circuit devices 74 on the intelligent power module 70. Since the configuration of the circuit devices 74 varies according to the specification of the intelligent power module 70, and the present invention is not limited by the configuration of the circuit devices 74.

The first heat dissipater 173 is installed on the upper surface of the intelligent power module 70 in a surface-contact manner and dissipates heat generated during the operation of the circuit devices 74 into the atmosphere. An adhesive and thermal transfer grease 75 can be coated between the upper surface of the intelligent power module 70 and the first heat dissipater 173. The first heat dissipater 173 covers the entire upper surface of the intelligent power module 70 and is wider than the upper surface of the intelligent power module 70 to protrude over the intelligent power module 70.

The second heat dissipater 76 is installed outside the drive circuit boards 40 such that one side of the second heat dissipater 76 contacts a side surface of the first heat dissipater 173 and another side thereof contacts the chassis base 11. That is, at the another side of the second heat dissipater 76, a gap G between the second heat dissipater 76 and the chassis base 11 must be 0. The first and second heat dissipaters 173 and 76 are attached via a coupler 77 such as a screw. In such an arrangement, second heat dissipater 76 draws heat from the first heat dissipater 173 to chassis base 11. Such an arrangement results in more heat drawn from circuit devices 74 thus keeping circuit devices 74 cool during their operation.

The first and second heat dissipaters 173 and 76 are made out of the same material that exhibits superior heat transfer characteristics. The first heat dissipater 173 includes a plurality of plate-shaped fins that are substantially vertical and thus orthogonal to the intelligent power module 70. The fins are arranged vertically so that air can smoothly flow in a vertical direction away from the intelligent power module when in use. However, the shapes of the first and second heat dissipaters 173 and 76 are not limited to the above descriptions and both first and second heat dissipaters 173 and 76 can be manufactured to have any shape that improves heat dissipation performance.

Chassis base 11 is a large metallic heat sink that is in constant contact with the atmosphere and has a much larger surface area in contact with the atmosphere than the first heat dissipater 173. As a result, second heat dissipater 76 serves to conduct heat to the large heat sink of the chassis base 11 so that heat generated by the circuit devices 74 can be dissipated more effectively. The result is that the circuit devices 74 can be held at a much lower temperature during their operation than when second heat dissipater 76 is not present.

Figure 5:
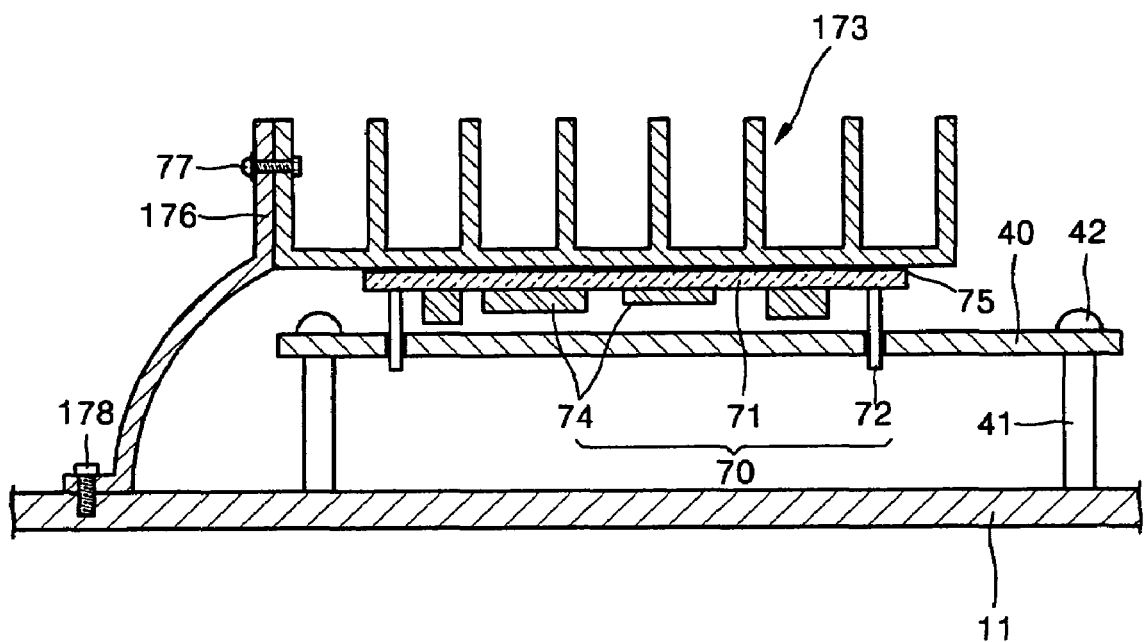
FIG. 5 is a cross-sectional view of a heat dissipation structure of an intelligent power module according to a second embodiment of the present invention.

Turning now to FIG. 5, FIG. 5 is a cross-sectional view of a heat dissipation structure of an intelligent power module 70 according to a second embodiment of the present invention. Referring to FIG. 5, the head dissipation structure according to the second embodiment includes an intelligent power module 70, a chassis base 11, the first heat dissipater 173, and a second heat dissipater 176.

The differences between the second embodiment of FIG. 5 and the first embodiment of FIG. 4 are that the second heat dissipater 176 has a curved portion so that the second heat dissipater 176 firmly contacts the chassis base 11 and that the second heat dissipater 176 is attached to the chassis base 11 by an additional coupler 178.

In the embodiment of FIG. 4, heat is transferred from the first heat dissipater 173 through the second heat dissipater 76 and to the chassis base 11. Since the chassis base 11 and the second heat dissipater 76 in FIG. 4 do not form a good contact, heat dissipation performance is somewhat limited and is not much improved over that of FIG. 3. However, in the present embodiment of FIG. 5, the second heat dissipater 176 has a curved shape and is coupled to the chassis base 11 using the coupler 178 such as a screw or TOX®. As a result, the second heat dissipater 176 contacts the chassis base 11 more closely than in the first embodiment so that heat is more smoothly and easily transferred from the second heat dissipater 176 to the chassis base 11 in the embodiment of FIG. 5 than in the first embodiment of FIG. 4.

Figure 6:
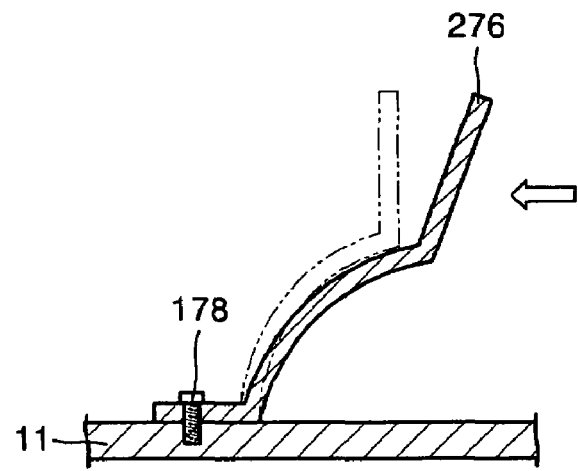
FIG. 6 is a cross-sectional view of a heat dissipater used for a heat dissipation structure of an intelligent power module according to a third embodiment of the present invention.
Figure 7:
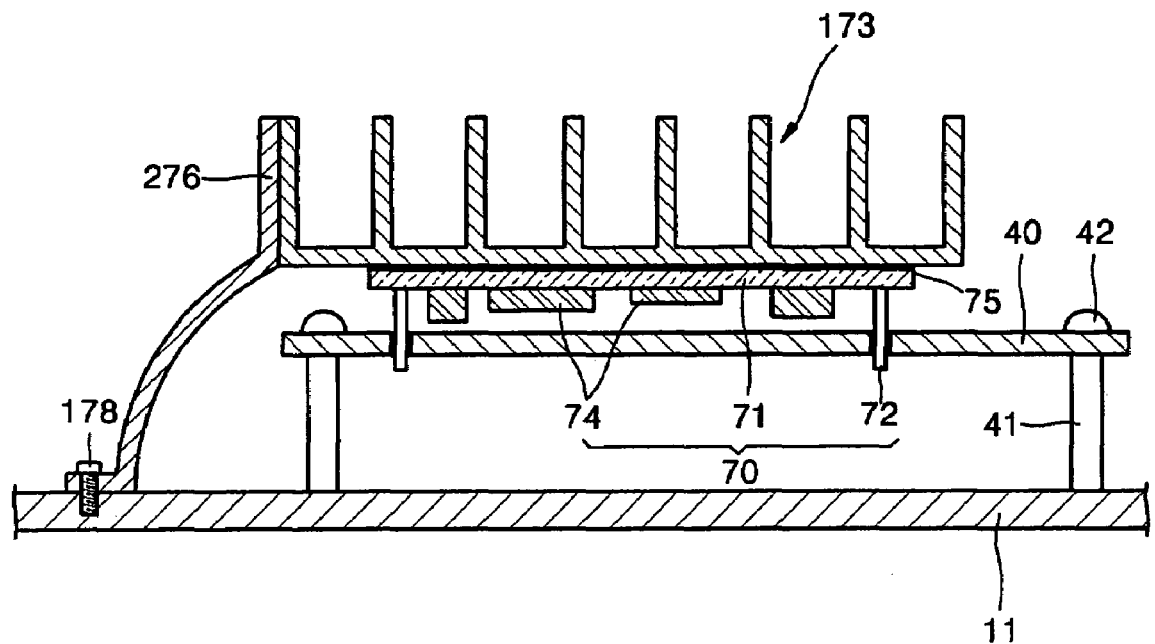
FIG. 7 is a cross-sectional view of the heat dissipation structure of an intelligent power module according to the third embodiment of the present invention.

Turning now to FIGS. 6 and 7, FIG. 6 is a cross-sectional view of a second heat dissipater 276 according to a third embodiment of the present invention and FIG. 7 is a cross-sectional view of the heat dissipation structure of an intelligent power module according to the third embodiment of the present invention using the second heat dissipater 276 of FIG. 6. As shown in FIG. 6, the second heat dissipater 276 is an elastic body biased in a direction off from a coupling portion of the chassis base 11. When a force is applied in a direction indicated by the arrow in FIG. 6, the second heat dissipater 276 is deformed as indicated by the imaginary line of FIG. 6.

When the second heat dissipater 276 is deformed by being pushed by the first heat dissipater 173 as shown in FIG. 7, the first and second heat dissipaters 173 and 276 contact each other more closely, even when no additional coupler is present. As a result, a contact portion between the chassis base 11 and the second heat dissipater 276 becomes more close.

In the first three embodiments of FIGS. 4, 5, and 7, the heat generated from the intelligent power module 70 is dissipated toward the chassis base 11 via the first and second heat dissipaters 173, 76, 176, and 276. Because of this, the intelligent power module 70 must be located close to the edge of the drive circuit boards 40. The next embodiment of FIG. 8 will illustrate a design where the intelligent power module need not be located close to an edge of a drive circuit board 40.

Figure 8:
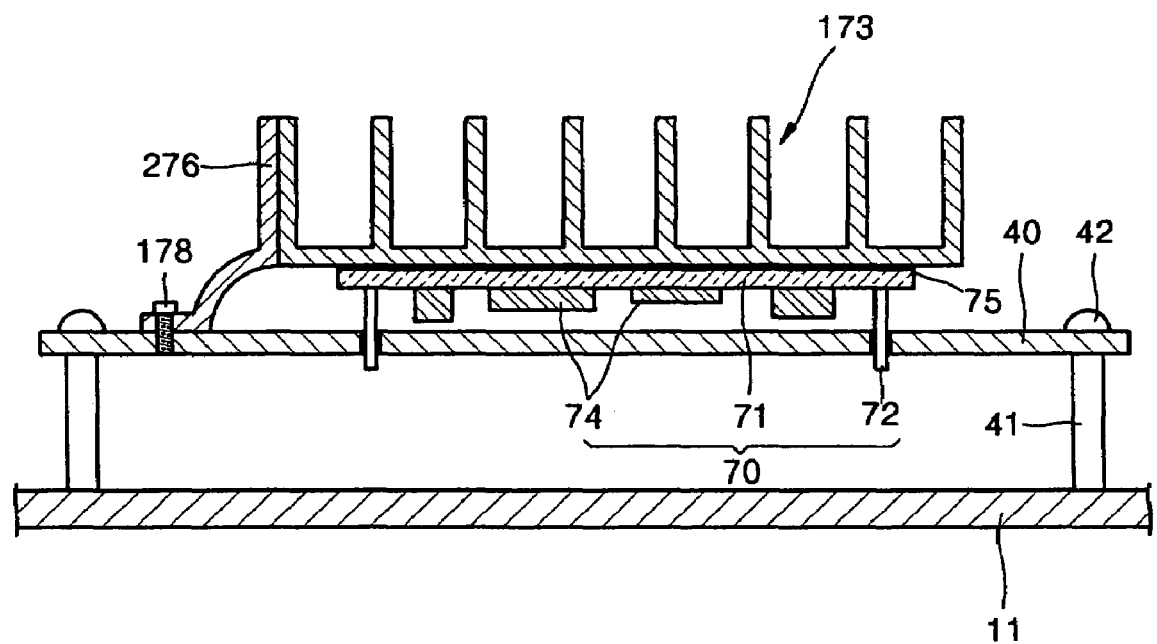
FIG. 8 is a cross-sectional view of the heat dissipation structure of an intelligent power module according to a fourth embodiment of the present invention.

Turning now to FIG. 8, FIG. 8 is a cross-sectional view of the heat dissipation structure of an intelligent power module according to a fourth embodiment of the present invention. Referring to FIG. 8, unlike the first three embodiments, a lower end of the second heat dissipater 276 is attached to the drive circuit boards 40 instead of the chassis base 11. An additional heat transfer unit (not shown), connecting the chassis base 11 and a portion of the drive circuit boards 40 where the second heat dissipater 276 is attached, can be further installed.

Drive circuit board 40 is a large non-metallic heat sink that is in constant contact with the atmosphere and has a much larger surface area in contact with the atmosphere than the first heat dissipater173. As a result, second heat dissipater 276 serves to conduct heat to the large heat sink of the drive circuit boards 40 so that heat generated by the circuit devices 74 can be dissipated more effectively. The result is that the circuit devices 74 can be held at a much lower temperature during their operation than when second heat dissipater 276 is not present.

The heat dissipation structure of an intelligent power module according to the embodiments of the present invention can be applied to a display module including the display panel 50, the drive circuit boards 40 driving the display panel 50, and the chassis base 11 supporting the display panel 50 and the drive circuit boards 40 as shown in FIG. 1. The heat dissipation structure of an intelligent power module according to the embodiments of the present invention has a greater heat dissipation effect when the heat dissipation structure is used for the drive circuit boards 40 of a plasma display device where there are numerous switching devices generating a great amount of heat.

As described above, according to the embodiments of the present invention, the heat transferred to the heat dissipater is transferred to other members such as the drive circuit boards or the chassis base so that the heat dissipation performance is further improved, compared to the case where only the heat dissipater above the intelligent module is installed. Also, since the second heat dissipater closely contacts the drive circuit boards, the chassis base, and the first heat dissipater, heat is more smoothly and easily drawn away from the circuit devices. Also, since the second heat dissipater can be an elastic member, the second heat dissipater can be easily installed to contact the first heat dissipater. Thus, the circuit devices can effectively be prevented from being damaged by heat generated during operation of the circuit devices installed in the intelligent power module.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A heat dissipation structure, comprising:
   a chassis base;
   a drive circuit board arranged on the chassis base;
   an intelligent power module arranged at a side of the drive circuit board, the intelligent power module comprising a plurality of circuit devices;
   a first heat dissipater having one surface contacting a surface of the intelligent power module, the first heat dissipater being adapted to dissipate heat generated by operation of the plurality of circuit devices; and
   a second heat dissipater having one side arranged in contact with another surface of the first heat dissipater and another side arranged to contact a surface of the chassis base, wherein the another side of the second heat dissipater is attached to the chassis base via a first coupler and the one side of the second heat dissipater is adapted to apply an elastic force toward the another surface of the first heat dissipater.

2. The heat dissipation structure of claim 1, wherein the first heat dissipater comprises a plurality of fins, each of said fins having a plate shape and being arranged orthogonal to the drive circuit board.

3. The heat dissipation structure of claim 1, wherein the plurality of circuit devices comprise a power device, a protection circuit, a drive circuit, and a control circuit.

4. The heat dissipation structure of claim 1, the second heat dissipater being adapted to transfer heat from the first heat dissipater to the chassis base.

5. The heat dissipation structure of claim 1, the second heat dissipater being separate and distinguished from the first heat dissipater.

6. A heat dissipation structure, comprising:
   a chassis base;
   a drive circuit board arranged on a surface of the chassis base; an intelligent power module arranged at a side of the drive circuit board, the intelligent power module comprising a plurality of circuit devices;
   a first heat dissipater having a surface contacting a surface of the intelligent power module, the first heat dissipater being adapted to dissipate heat generated by operation of the plurality of circuit devices; and
   a second heat dissipater having one side arranged to contact the first heat dissipater and another side arranged to contact a surface of the drive circuit board, wherein the second heat dissipater comprises an elastic body and has one side attached to the drive circuit board via a first coupler and another side arranged to apply an elastic force toward an end portion of the first heat dissipater.

7. The heat dissipation structure of claim 6, wherein the first heat dissipater comprises a plurality of fins, each fin having a plate shape and being normal to the surface of the intelligent power module.

8. The heat dissipation structure of claim 6, further comprising a heat transfer unit connected to the chassis base and arranged on a portion of the drive circuit board that contacts the second heat dissipater.

9. The heat dissipation structure of claim 6, wherein the plurality of circuit devices comprise a power device, a protection circuit, a drive circuit, and a control circuit.

10. A display module, comprising:
    a display panel;
    a drive circuit board adapted to drive the display panel;
    a chassis base supporting the display panel and the drive circuit board;
    an intelligent power module arranged at a side of the drive circuit board, the intelligent power module comprising a plurality of circuit devices;
    a first heat dissipater having one surface contacting a surface of the intelligent power module, the first heat dissipater being adapted to dissipate heat generated by operation of the plurality of circuit devices; and
    a second heat dissipater having a one side arranged to contact another surface of the first heat dissipater and another side arranged to contact one of the drive circuit board and the chassis base, wherein the second heat dissipater is an elastic body, the one side of the second heat dissipater is arranged to apply an elastic force to the another surface of the first heat dissipater and the another side of the second heat dissipater is attached to the one of the drive circuit board and the chassis base via a first coupler.

11. The display module of claim 10, wherein the first heat dissipater comprises a plurality of fins, each fin having a plate shape being arranged orthogonal to the drive circuit board.

12. The display module of claim 10, wherein the plurality of circuit devices comprise a power device, a protection circuit, a drive circuit, and a control circuit.

13. The display module of claim 10, wherein the display module is a plasma display module that is adapted for a plasma display device.

14. The display module of claim 10, the second heat dissipater being arranged to transfer heat from the first heat dissipater to the one of the drive circuit board and the chassis base.

* * * * *